United States Patent
Stamper

(10) Patent No.: US 7,078,814 B2
(45) Date of Patent: Jul. 18, 2006

(54) METHOD OF FORMING A SEMICONDUCTOR DEVICE HAVING AIR GAPS AND THE STRUCTURE SO FORMED

(75) Inventor: Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/709,722

(22) Filed: May 25, 2004

(65) Prior Publication Data

US 2005/0275104 A1     Dec. 15, 2005

(51) Int. Cl.
*H01L 23/52* (2006.01)
*H01L 23/48* (2006.01)
*H01L 29/40* (2006.01)

(52) U.S. Cl. ............ 257/760; 257/758; 257/759; 257/760; 257/774; 438/619; 438/586

(58) Field of Classification Search ........ 257/758–760, 257/774, E21.573, E21.581, E21.584, E21.585, 257/E21.587; 438/619, 586, 723
See application file for complete search history.

(56) References Cited

U.S. PATENT DOCUMENTS

| | | | |
|---|---|---|---|
| 5,461,003 A | 10/1995 | Havemann et al. ......... | 438/666 |
| 5,468,685 A | 11/1995 | Orisaka et al. ............. | 438/694 |
| 5,470,801 A | 11/1995 | Kapoor et al. .............. | 438/471 |
| 5,548,159 A | 8/1996 | Jeng ........................... | 257/634 |
| 5,965,202 A | 10/1999 | Taylor-Smith et al. ...... | 427/245 |
| 5,994,776 A | 11/1999 | Fang et al. ................. | 257/758 |
| 6,090,698 A * | 7/2000 | Lee ............................ | 438/619 |
| 6,103,619 A * | 8/2000 | Lai ............................ | 438/638 |
| 6,177,329 B1 * | 1/2001 | Pang .......................... | 438/400 |
| 6,245,662 B1 * | 6/2001 | Naik et al. .................. | 438/622 |
| 6,265,321 B1 * | 7/2001 | Chooi et al. ................ | 438/725 |
| 6,265,780 B1 | 7/2001 | Yew et al. .................. | 257/759 |
| 6,287,979 B1 | 9/2001 | Zhou et al. ................. | 438/723 |
| 6,297,554 B1 * | 10/2001 | Lin ............................ | 257/752 |
| 6,319,854 B1 | 11/2001 | Aoi ............................ | 438/781 |
| 6,333,265 B1 * | 12/2001 | Dixit et al. ................. | 438/680 |
| 6,362,091 B1 | 3/2002 | Andideh et al. ............ | 438/624 |
| 6,387,824 B1 | 5/2002 | Aoi ............................ | 438/778 |
| 6,413,852 B1 | 7/2002 | Grill et al. .................. | 438/619 |
| 6,479,374 B1 | 11/2002 | Ioka et al. .................. | 438/601 |
| 6,531,755 B1 * | 3/2003 | Usami ........................ | 257/520 |
| 6,577,011 B1 | 6/2003 | Buchwalter et al. ........ | 257/758 |
| 6,589,644 B1 | 7/2003 | Yamada et al. ........... | 428/312.6 |
| 6,596,467 B1 | 7/2003 | Gallagher et al. .......... | 430/314 |
| 6,596,624 B1 | 7/2003 | Romankiw .................. | 438/619 |
| 6,603,204 B1 | 8/2003 | Gates et al. ................ | 257/760 |
| 2002/0055243 A1 * | 5/2002 | Lee ............................ | 438/586 |
| 2002/0158337 A1 * | 10/2002 | Babich et al. .............. | 257/758 |
| 2002/0175417 A1 * | 11/2002 | Morrow ...................... | 257/758 |
| 2003/0114013 A1 | 6/2003 | Hedrick et al. ............. | 438/734 |

\* cited by examiner

*Primary Examiner*—Kenneth Parker
*Assistant Examiner*—Chris Chu
(74) *Attorney, Agent, or Firm*—Schmeiser, Olsen & Watts; Anthony Canale

(57) ABSTRACT

A method of forming a semiconductor device, and the device so formed. Depositing alternating layers of a first and a second dielectric material, wherein the first and second dielectric materials are selectively etchable at different rates. Forming a first feature within the alternating layers of dielectric material. Selectively etching the alternating layers of dielectric material to remove at least a portion of the first dielectric material in each layer having the first dielectric material and leaving the second dielectric material as essentially unetched.

20 Claims, 10 Drawing Sheets

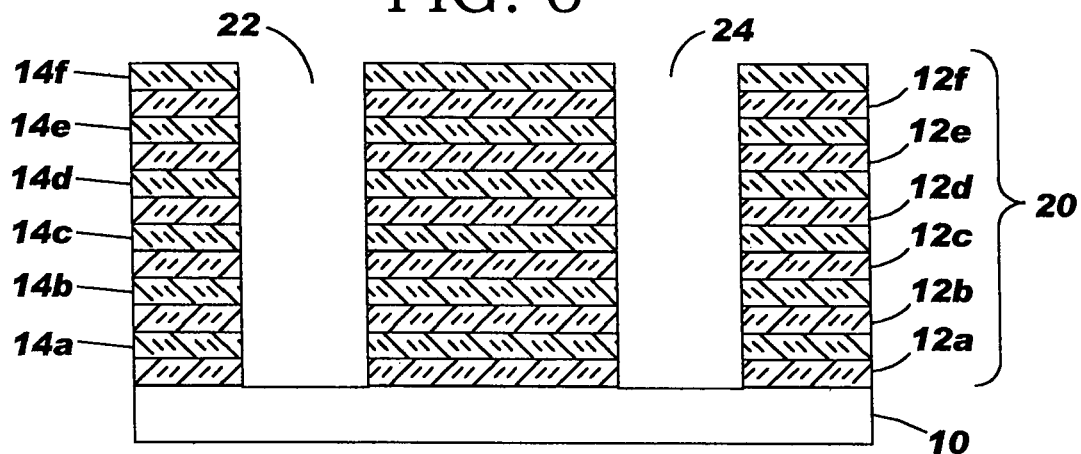
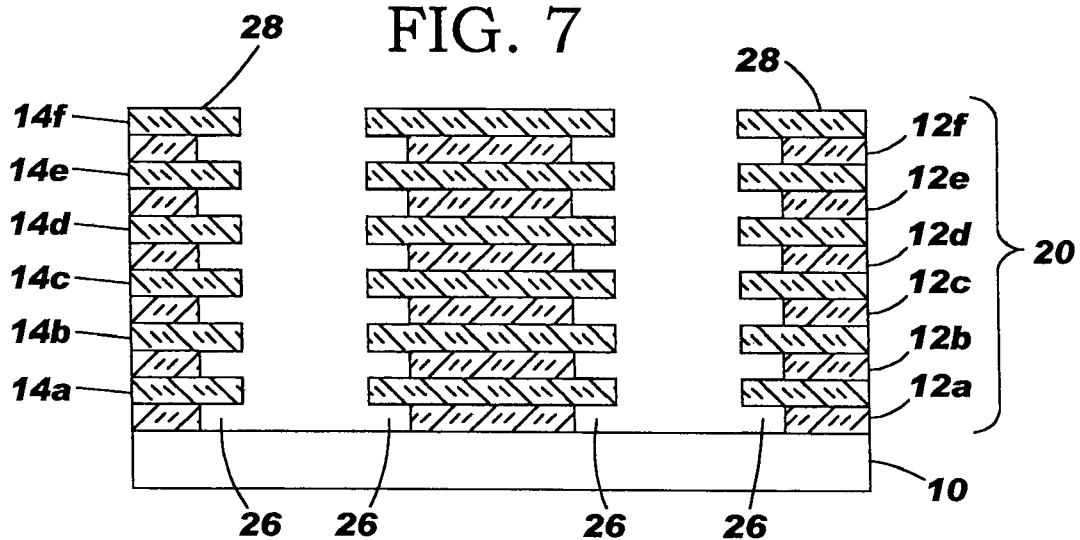
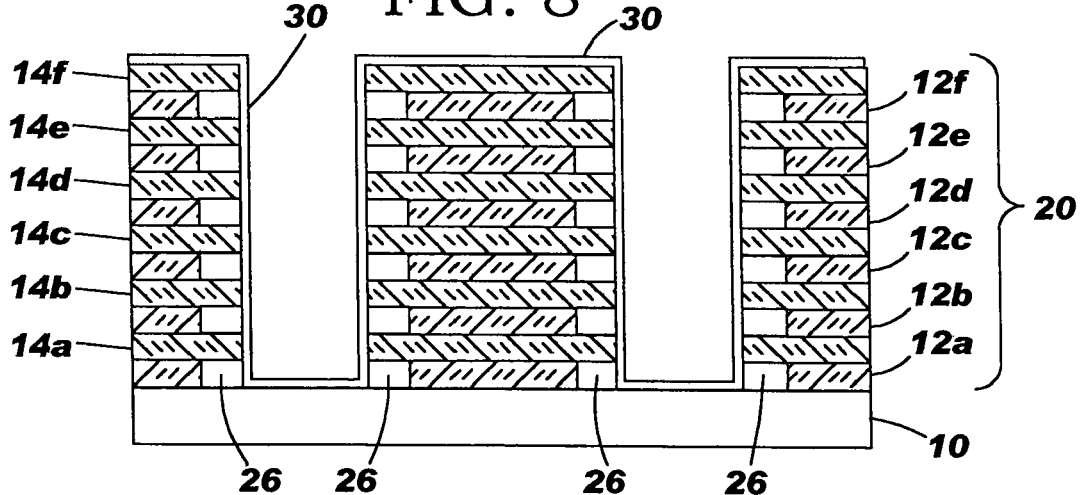

US 7,078,814 B2

METHOD OF FORMING A SEMICONDUCTOR DEVICE HAVING AIR GAPS AND THE STRUCTURE SO FORMED

BACKGROUND OF INVENTION

1. Technical Field

The present invention relates generally to semiconductor devices, and more particularly, to a method of forming a semiconductor device having air gaps within the wiring levels, and the structure so formed.

2. Related Art

As semiconductor devices continue to shrink, the distance between device features is reduced. Within metal wiring layers reducing the distance between features causes an increased capacitance. Therefore, there is a need in the industry for a method of forming a semiconductor device capable of maintaining a lower capacitance while reducing the distance between device features that overcomes the above and other problems.

SUMMARY OF INVENTION

The present invention provides a method of forming a semiconductor device having air gaps within the metal wiring level, and the structure so formed, that solves the above-stated problems.

A first aspect of the invention provides a method of forming a semiconductor device, comprising: depositing alternating layers of a first and a second dielectric material, wherein the first and second dielectric materials are selectively etchable at different rates; forming a first feature within the alternating layers of dielectric material; and selectively etching the alternating layers of dielectric material to remove at least a portion, but not all, of the first dielectric material in each layer having the first dielectric material and leaving the second dielectric material as essentially unetched.

A second aspect of the invention provides a method of forming a semiconductor device, comprising: depositing alternating layers of a first and a second insulative material; forming a damascene feature; and forming openings within the layers of first insulative material.

A third aspect of the invention provides a semiconductor device, comprising: semiconductor device, comprising: a metal wiring level having alternating layers of a first dielectric material and a second dielectric material having a first feature formed within the alternating layers of first and second dielectric material; and a plurality of openings within the first dielectric material.

A fourth aspect of the invention provides a semiconductor device, comprising: a plurality of alternating first and second insulative layers, wherein the first and second insulative layers have different etch rates; a first feature formed within the first and second insulative layers; a plurality of openings within the plurality of first insulative layers formed during a selective etch.

The foregoing and other features and advantages of the invention will be apparent from the following more particular description of the embodiments of the invention.

BRIEF DESCRIPTION OF DRAWINGS

The embodiments of this invention will be described in detail, with reference to the following figures, wherein like designations denote like elements, and wherein:

FIG. 6 depicts the device of FIG. 5 having a pair of damascene features formed therein;

FIG. 7 depicts the device of FIG. 6 having a plurality of air gaps formed within select insulative layers;

FIG. 8 depicts the device of FIG. 7 having a conformal liner formed thereover;

DETAILED DESCRIPTION

Although certain embodiments of the present invention will be shown and described in detail, it should be understood that various changes and modifications might be made without departing from the scope of the appended claims. The scope of the present invention will in no way be limited to the number of constituting components, the materials thereof, the shapes thereof, the relative arrangement thereof, etc. Although the drawings are intended to illustrate the present invention, the drawings are not necessarily drawn to scale.

Figure 1:
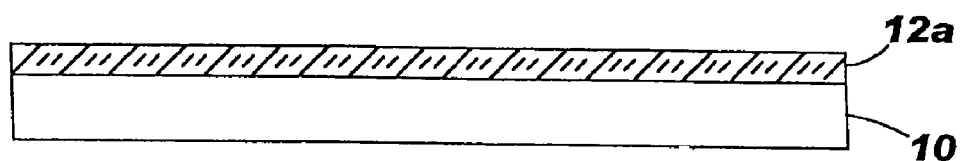
FIG. 1 depicts a cross-sectional view of a device comprising a pre-metal dielectric layer and a first insulative layer thereon, in accordance with embodiments of the present invention.

FIG. 1 depicts a cross-sectional view of a pre-metal dielectric (PMD) 10 upon which a first insulative layer 12a is formed. The PMD 10 comprises one or more dielectric materials, such as a $SiO_2$-based material, i.e., $SiO_2$, PSG, BPSG, SiCOH (OSG), SiLK™ (Dow Chemical Corp.), SiN, SiC, SiCN, C—H, etc. The first insulative layer 12a comprises a dielectric material, in this example, an organic dielectric material, such as, polyarylene ether (SILK™), parylene (N or F), Teflon, or other porous versions of these films. The type of organic dielectric material used may depend upon the deposition technique used. For example, if the first insulative layer 12a is formed using chemical vapor deposition (CVD) or plasma enhanced chemical vapor deposition (PECVD), the parylene (N or F), Teflon, or other porous versions of these films may be used. If, however, first insulative layer 12a is formed using spin-on deposition, the SILK™ may be used. The first insulative layer 12a may be formed having a thickness within the range of 5–10 nm.

Figure 2:
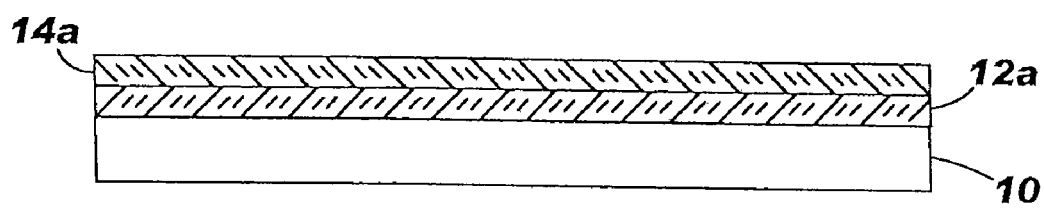
FIG. 2 depicts the device of FIG. 1 having a second insulative layer thereon.

A second insulative layer 14a is then formed on the first insulative layer 12a, as illustrated in FIG. 2. The second insulative layer 14a comprises a dielectric material, in this example, an inorganic dielectric material, such as, SiCOH (OSG), $SiO_2$, florinated $SiO_2$ (FSG), such as methylsilesquoxane (MSQ), or porous versions of these materials. As with the first insulative layer 12a, the second insulative layer 14a may be formed using CVD, PECVD, spin-on deposition, or other similar deposition techniques. The second insulative layer 14a may be formed having a thickness within the range of 5–10 nm.

Figure 3:
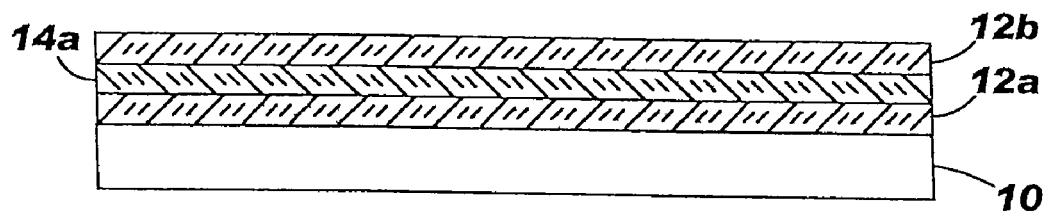
FIG. 3 depicts the device of FIG. 2 having a third insulative layer thereon.

As illustrated in FIG. 3, a third insulative layer 12b is formed on the second insulative layer 14a. The third insulative layer 12b comprises an organic dielectric material similar to that of the first insulative layer 12a. The third insulative layer 12b is formed using similar techniques, and having a similar thickness, to that of the first insulative layer 12a.

Figure 4:
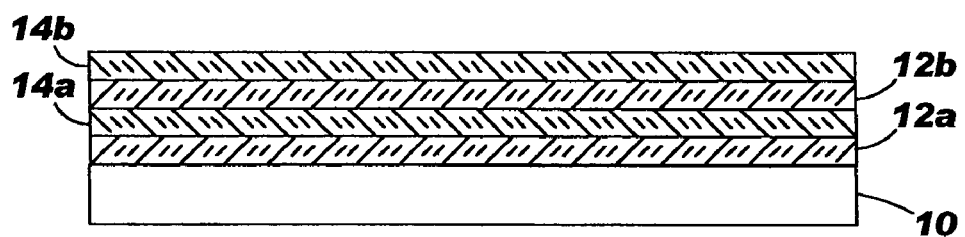
FIG. 4 depicts the device of FIG. 3 having a fourth insulative layer thereon.

As illustrated in FIG. 4, a fourth insulative layer 14b is formed on the third insulative layer 12b. The fourth insulative layer 14b comprises an inorganic dielectric material similar to that of the second insulative layer 14a. The fourth insulative layer 14b is formed using similar techniques, and having a similar thickness, to that of the second insulative layer 14a.

Figure 5:
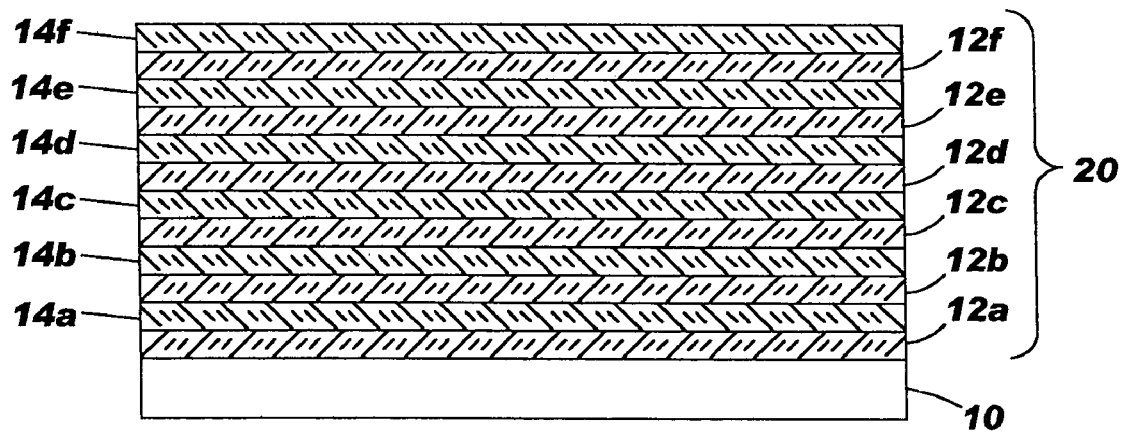
FIG. 5 depicts the device of FIG. 4 having a plurality of insulative layers thereon forming a first metal wiring level.

Alternating layers of organic and inorganic dielectric material may be formed in this manner on the substrate 10, as illustrated in FIG. 5, to a desired thickness for a first metal wiring level 20. In the present example layers 12c–12f comprise an organic dielectric material similar to that of the first and third insulative layers 12a, 12b. Likewise, layers 14c–14f comprise an inorganic dielectric material similar to that of the second and fourth insulative layers 14a, 14b. The number of layers depicted in the present invention is for illustrative purposes only, and is not intended to be limiting in anyway, so long as at least one organic layer and one inorganic layer are present. Also, it should be noted that the organic dielectric material is deposited first in the present example for illustrative purposes only. Either the inorganic or organic dielectric material may be deposited first.

It should also be noted that it may be desirable to deposit the alternating layers of organic and inorganic insulative material in-situ. For example, a single PECVD chamber may be used to deposit both the inorganic and organic layers without leaving the chamber. Also, a spin-apply track may be used wherein the alternating layers are both deposited and cured within the same chamber. Using either technique, the first insulative layer 12a may alternatively be deposited having twice the desired thickness. Thereafter, the first insualtive layer 12a is exposed to a plasma or thermal treatment wherein an upper portion of the first insulative layer 12a is converted into the material needed in the second insulative layer 14a. These methods may help to decrease unevenness in thickness between the organic and inorganic insulative layers, and may increase adhesion between the organic and inorganic insulative layers.

As illustrated in FIG. 6, after the desired thickness for the first wiring level 20 has been achieved, a first feature 22 and, in this example, a second feature 24, are formed within the first wiring level 20. The first and second features 22, 24 are wire trenches for wiring lines that may be formed using conventional patterning and etching techniques.

Following formation of the first and second features 22, 24, a selective etch is performed to remove at least portions of the organic dielectric material within the first wiring level 20, in this example, within layers 12a–12f (FIG. 7). In the present example, where the organic dielectric material comprises p-SILK™ and the inorganic dielectric material comprises p-OSG, an $N_2$ plasma, $H_2$ plasma, or other similar plasma etch may be used to selectively remove the organic dielectric material. The $N_2$ or $H_2$ etch may be operated in a pressure range of about 3–200 mT at typical parallel plate or high density plasma power and flow conditions. Alternatively, portions of the inorganic dielectric material (p-OSG) may be etched using a wet etchant, such as a 100:1 DHF, leaving the SiLK™ material within layers 14a–14f.

As illustrated in FIG. 7, openings or air gaps 26 are formed following the selective etch of the organic dielectric material within layers 12a–12f. The air gaps 26 are formed within the organic dielectric material of layers 12a–12f, and not within the inorganic dielectric material within layers 14a–14f, because the etch rate of the organic dielectric material of layers 12a–12f is faster than the etch rate of the inorganic dielectric material of layers 14a–14f. The air gaps 26 within the first wiring level 20 reduce the capacitance within the overall device. The size of the air gaps 26 is determined by calibrating the selective etch to remove a portion, but not all, of the organic dielectric material. At least some of the organic dielectric material should remain after the selective etch to prevent mechanical failure of the device, e.g., collapse of the inorganic dielectric layers 14a–14f.

Table 1 below shows estimated comparisons of the capacitance value of the device, using different organic and inorganic materials, with and without the air gaps 26. In particular, the data is modeled from a sample having a first wiring level 20 wire width of about 100 nm and a wire spacing of about 100 nm, wherein about 33 nm of the 100 nm organic dielectric within the wire spacing has been removed. This results in about a 20% reduction in Keff (the effective dielectric constant of the device), which translates into about a 20% reduction in the capacitance of the device, since Keff is proportional to the capacitance of the device.

TABLE 1

Comparison of Keff with air gaps and Keff without air gaps.

| Inorganic Dielectric | Organic Dielectric | Keff no air gaps | Keff with air gaps | % reduction in Keff |
|---|---|---|---|---|
| $SiO_2$ (K = 4) | SiLK(K = 2.6) | 3.30 | 2.70 | 18% |
| SiCOH (K = 3) | SiLK(K = 2.6) | 2.80 | 2.24 | 20% |
| p-SiCOH*(K = 2.5) | SiLK(K = 2.6) | 2.55 | 1.99 | 22% |
| p-$SiO_2$*(K = 2) | p-SiLK*(K = 2.2) | 2.10 | 1.68 | 20% |

(*The "p-" indicates that the dielectric is a porous dielectric.)

After the air gaps 26 are formed, the surface 28 of the first metal wiring layer 20 is sealed to prevent metal, deposited in the next step, from leaking into the air gaps 26. This may be accomplished in several different ways. For example, a conformal liner 30, such as a dielectric having a low dielectric constant, i.e., SiCOH, $SiO_2$, SiN, SiC, and SiCN, etc., is deposited over the surface 28 of the first metal wiring layer 20 (FIG. 8). The liner 30 may be deposited, having a thickness in the range of about 1–10 nm, using PECVCD, HDPCVD, SACVD, APCVD, THCVD, or other similar deposition techniques.

Alternatively, if the air gaps 26 are small, e.g., in the range of about 1–10 nm, the metal deposited in the following step may be sufficient to seal the air gaps 26. A plasma vapor deposition (PVD), chemical vapor deposition (CVD), atomic layer deposition (ALD), or other similar deposition technique may also be used to deposit the metal such that very few metal ions actually penetrate the air gaps 26.

Figure 9:
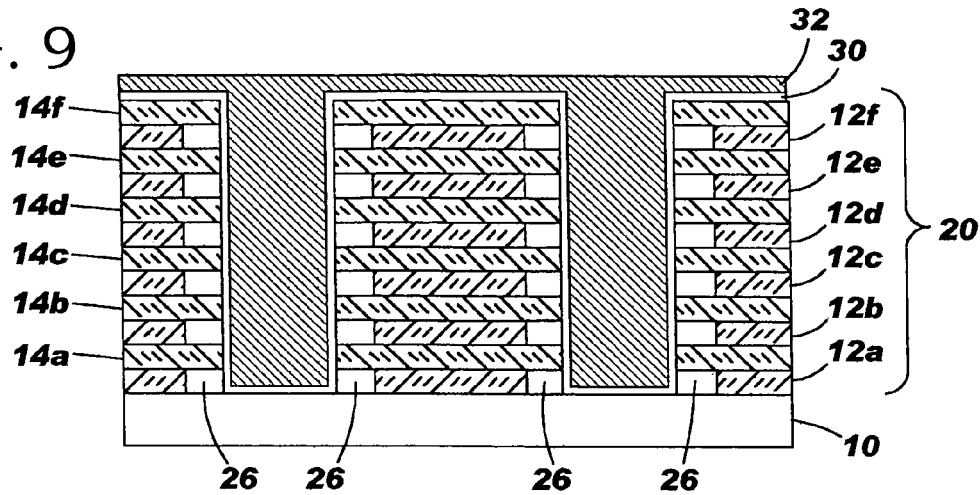
FIG. 9 depicts the device of FIG. 8 having a conductive layer deposited thereon.
Figure 10:
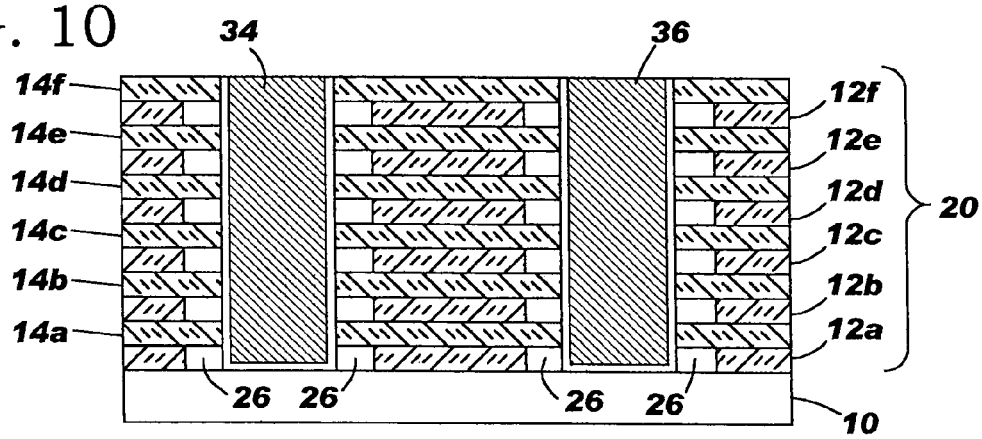
FIG. 10 depicts the device of FIG. 9 following polishing.

After the air gaps 26 are sealed, if a separate sealing process is used as described supra, a conductive material 32 is deposited over the surface 28 of the first wiring level 20 filling the first and second features 22, 24 (FIG. 9). The conductive material 32 may comprise copper lined with a thin refractory metal liner, such as tantalum, as known in the art, or other similarly used material. The surface 28 of the first wiring level 20 is polished, using conventional techniques, to remove the excess conductive material 32, leaving the conductive material 32 within the first and second features 22, 24 to form a first wire 34 and a second wire 36 (FIG. 10).

Figure 11:
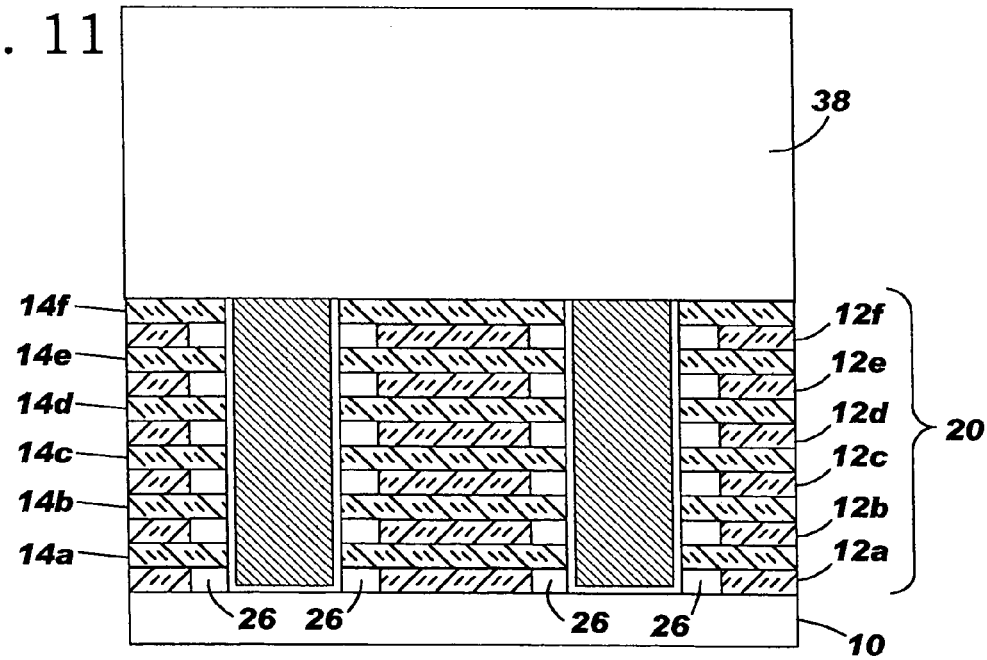
FIG. 11 depicts the device of FIG. 10 having an insulative layer formed over the first metal wiring level.

The first metal wiring level 20 illustrated in this example is a single damascene wiring level. As illustrated in FIGS. 11–17, the present invention is designed for use in conjunction with a dual damascene wiring level as well. As shown in FIG. 11, a third insulative layer 38 may be deposited over the surface 28 of the first wiring level 20. The third insulative layer 38 may comprises one or more dielectric materials, having a low dielectric constant, that is not susceptible to removal during the subsequent etch process used to form the air gaps (formed infra). For example, the third insulative layer 38 may comprise porous SiCOH (p-OSG), $SiO_2$, florinated $SiO_2$ (FSG), SiCOH (OSG), such as methylsilesquoxane (MSQ), or porous versions of all these materials. The third insulative layer 38 may be formed using CVD, PECVD, spin-on deposition, or other similar deposition techniques, and may consist of multiple layers, such as SiN, SiC, FSG, etc. The third insulative layer 38 may be formed having a thickness approximately equal to the final via height, e.g., 0.1 to 1.0 micron.

Figure 12:
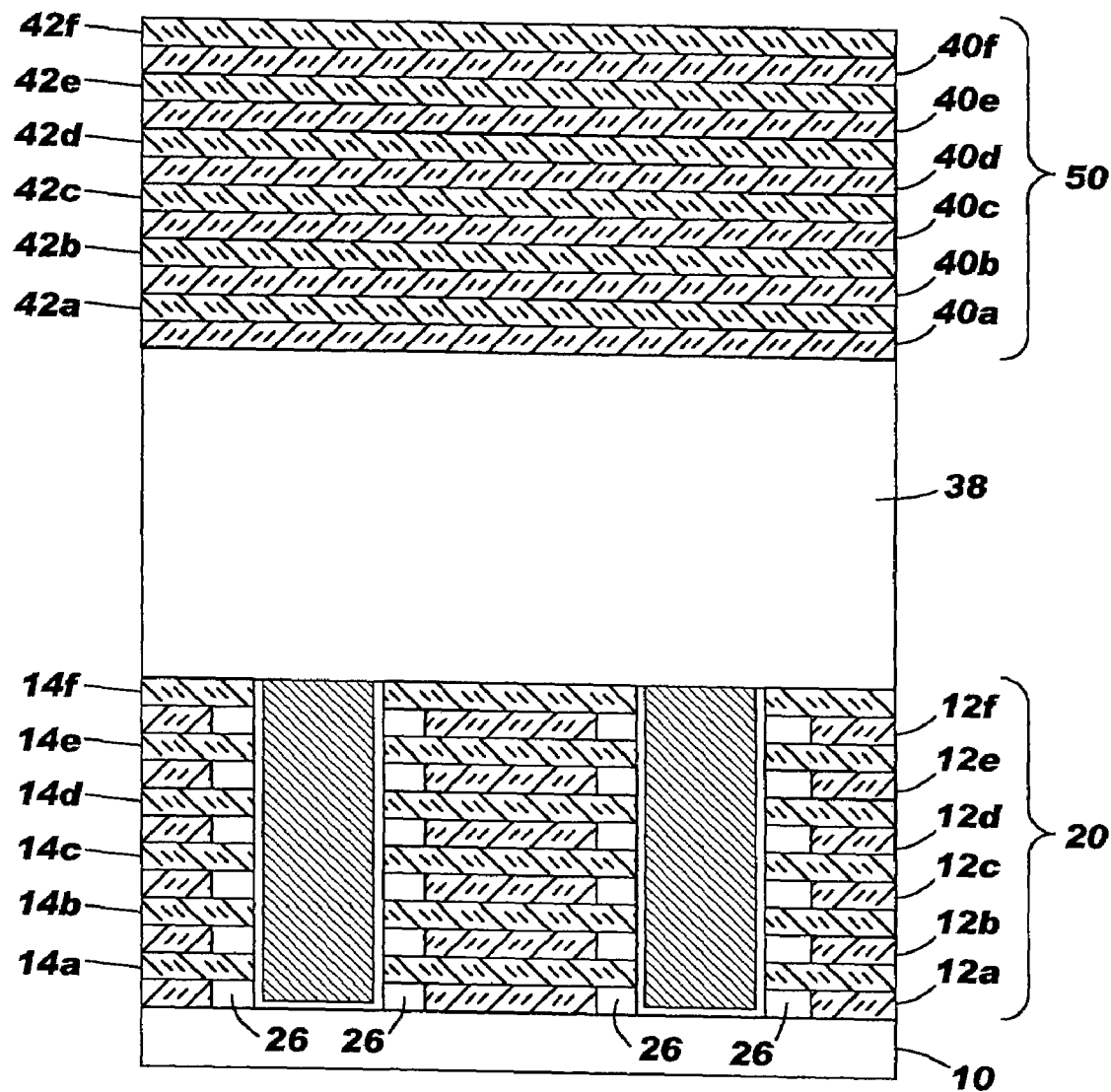
FIG. 12 depicts the device of FIG. 11 having a plurality of insulative layers forming a second metal wiring level.

Alternating layers of organic dielectric material 40a–40f and inorganic dielectric material 42a–42f are deposited on the surface 40 of the third insulative layer 38, as shown in FIG. 12, to form a second wiring level 50. The alternating layers are similar to those formed in the first metal wiring level 20 (that is, organic dielectric material, inorganic dielectric material, organic dielectric material, inorganic dielectric material, etc.), and are formed in a similar manner.

Figure 13:
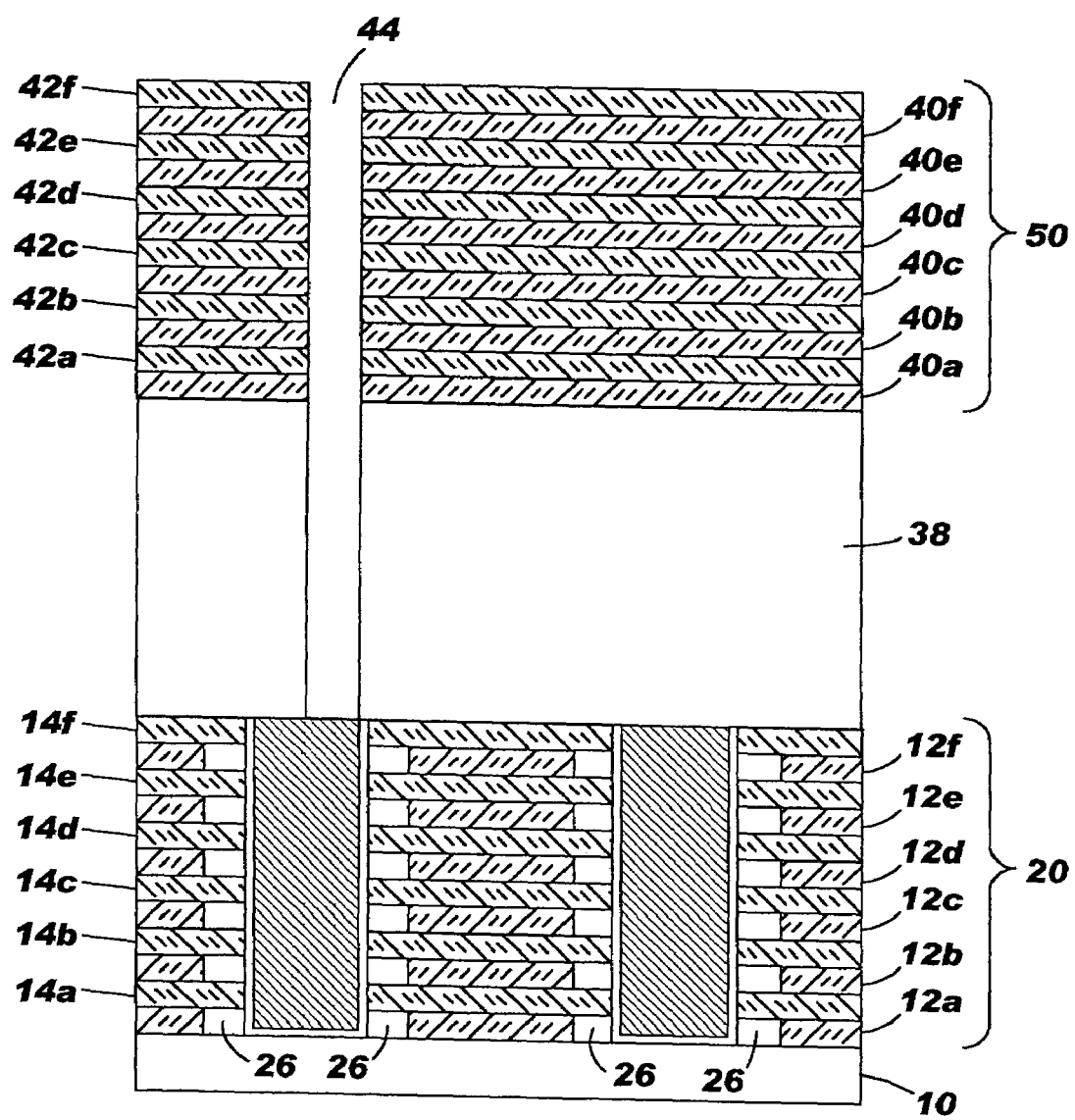
FIG. 13 depicts the device of FIG. 12 having a first damascene feature formed therein.

After the second wiring level 50 is formed, a first dual damascene feature 44 is formed within the alternating layers of inorganic dielectric material 40a–40f, organic dielectric material 42a–42f, and the third insulative layer 38. As illustrated in FIG. 13, the first dual damascene feature 44 is a via trench. The via trench 44 is formed down to the first metal wiring level 20 using conventional patterning and etching techniques.

Figure 14:
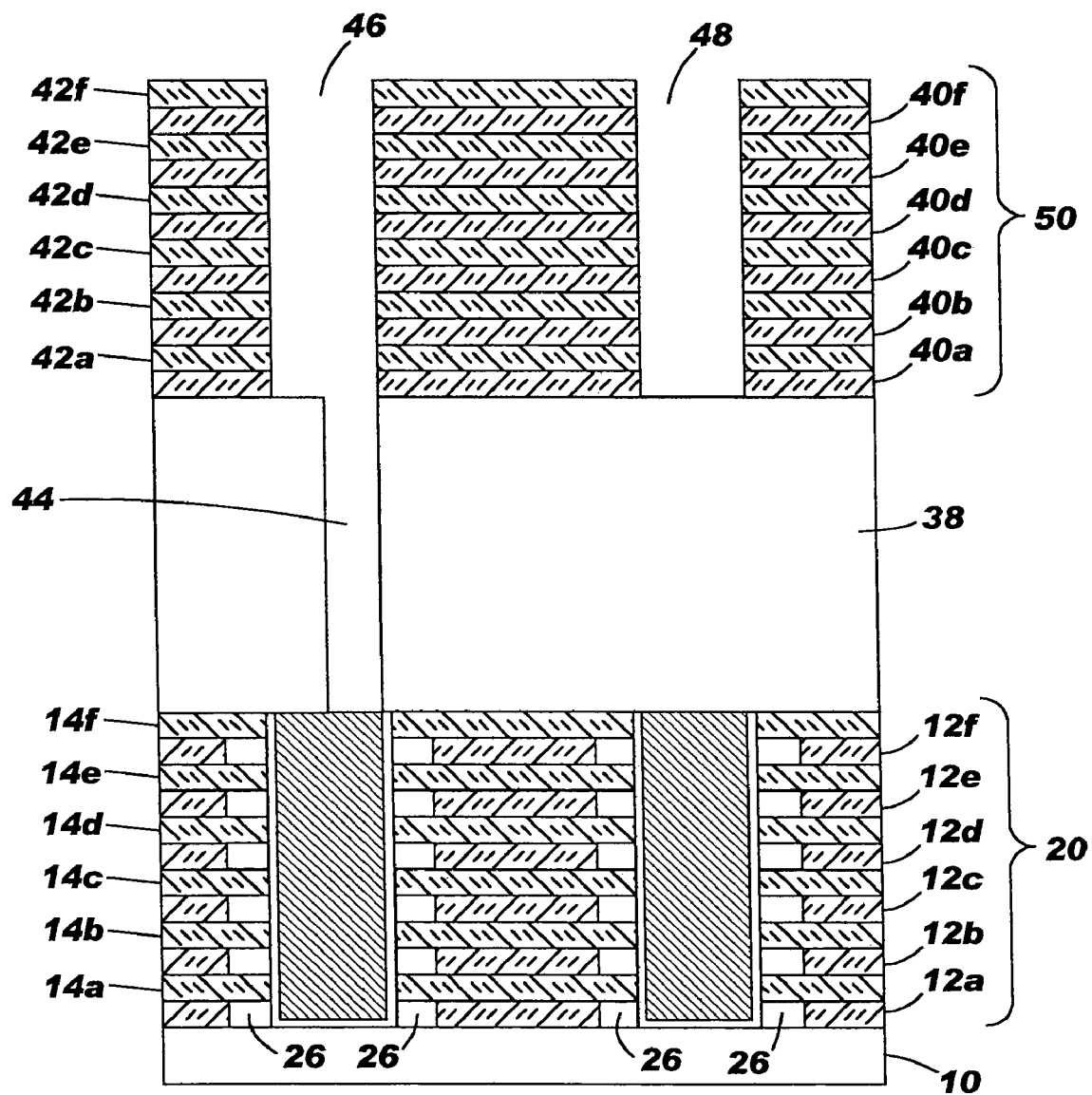
FIG. 14 depicts the device of FIG. 13 having second damascene features formed therein.

As illustrated in FIG. 14, a second dual damascene feature 46 and a second trench 48 are formed within the alternating layers of organic dielectric material 40a–40f and inorganic dielectric material 42a–42f. The second dual damascene feature 46 is also a wire trench formed, using conventional patterning and etching techniques, down to the surface of the third insulative layer 38. Alternatively, a trench first-via second process, as known in the art, may be employed. Likewise, a multi-layer hardmask may be used, in which the first damascene feature is patterned and etched into the upper hardmask, as known in the art.

After the first and second dual damascene features 44, 46, 48 are formed, a selective etch is performed to remove at least portions of the organic dielectric material 40a–40f within the second wiring level 50. As described above, where the organic dielectric material comprises p-SILK™ and the inorganic dielectric material comprises p-OSG, an $N_2$ plasma, $H_2$ plasma, or other similar plasma etch may be used to selectively remove the organic dielectric material. The $N_2$ or $H_2$ etch may be operated in a pressure range of about 3–200 mT at typical parallel plate or high density plasma power and flow conditions.

Figure 15:
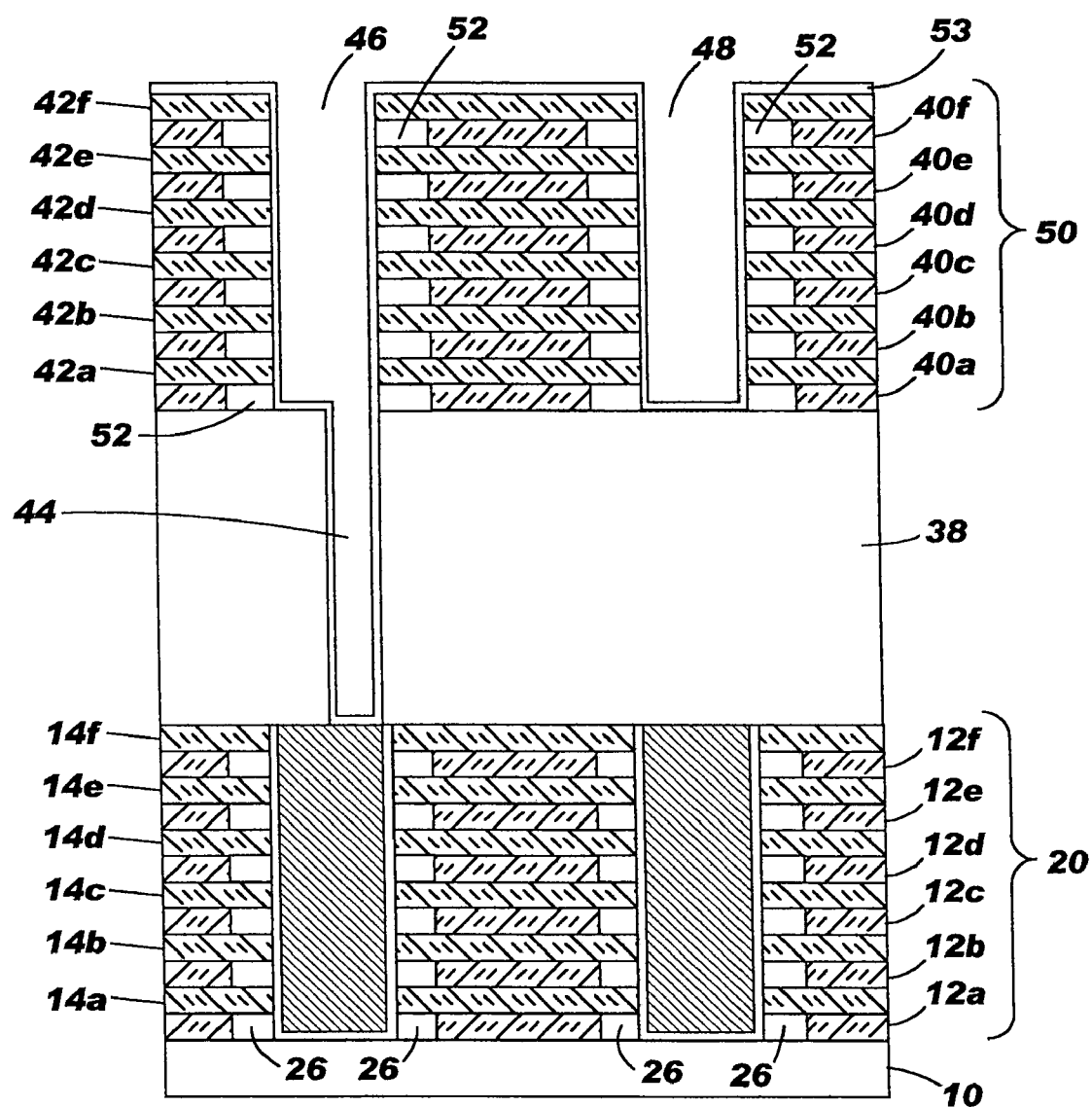
FIG. 15 depicts the device of FIG. 14 having a plurality of air gaps formed within select insulative layers.

As illustrated in FIG. 15, openings or air gaps 52 are formed within the second wiring level 50 following the selective etch. It should be noted that no air gaps 52 are formed in the third insulative layer 38 of the present example to add mechanical strength and stability to the overall device. A conformal liner 53 is then formed on the surface of the second metal wiring level 50 sealing the second metal wiring level 50 to prevent metal, deposited in the next step, from leaking into the air gaps 52.

Figure 16:
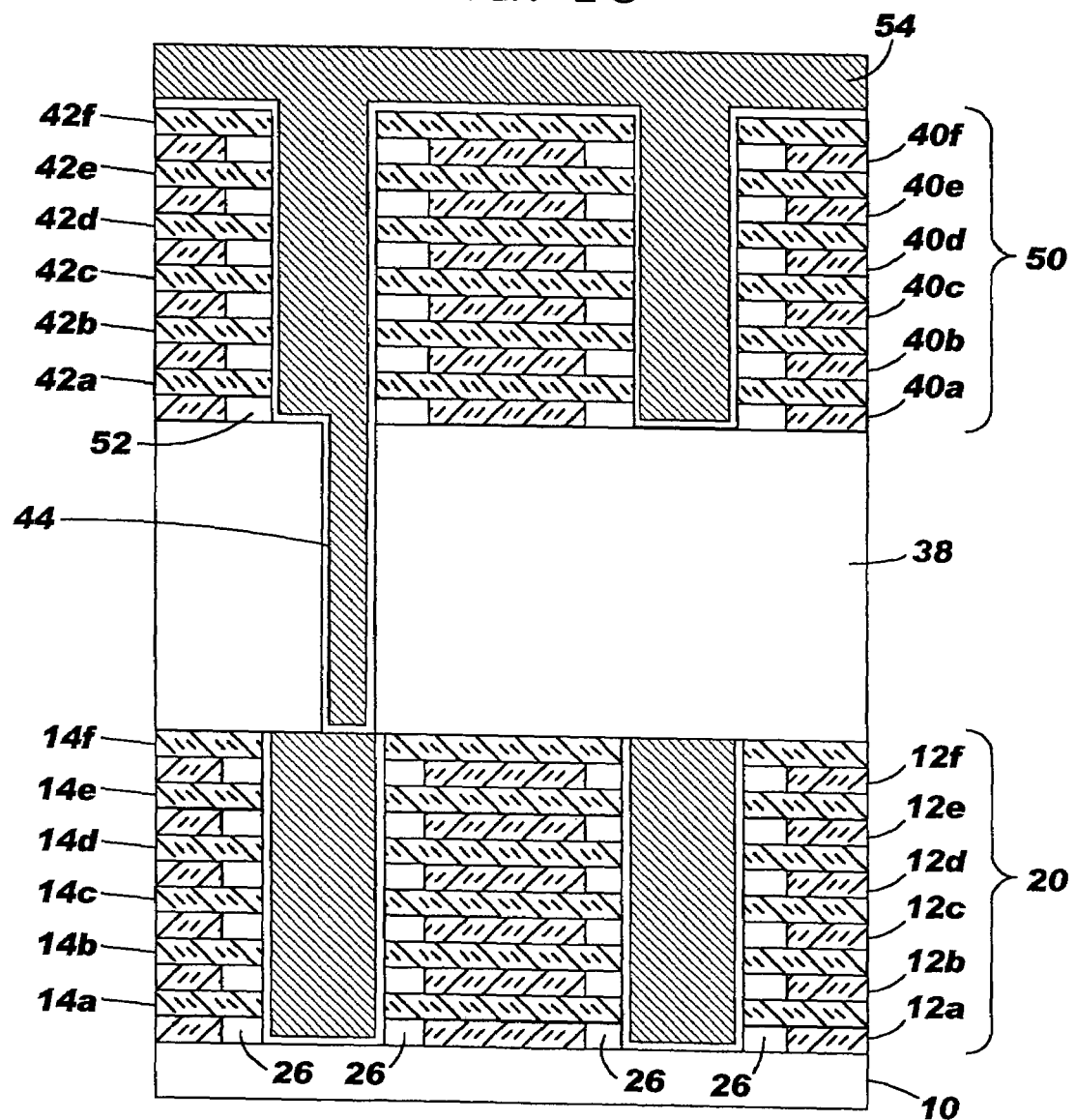
FIG. 16 depicts the device of FIG. 15 having a conductive layer deposited thereon.
Figure 17:
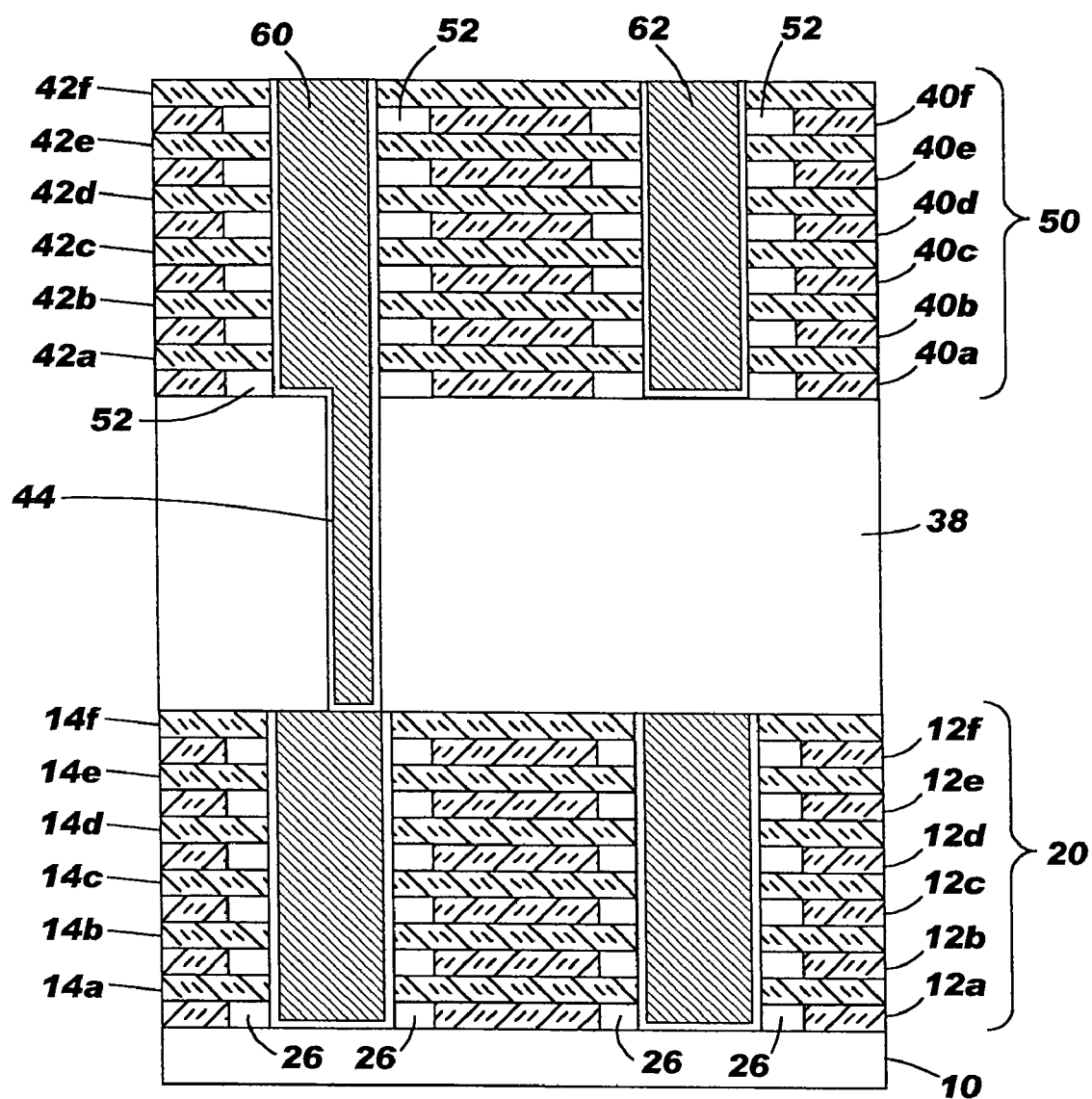
FIG. 17 depicts the device of FIG. 16 following polishing.

A conductive material 54 is deposited over the surface of the second wiring level 50 filling the via trench 44 and trenches 46, 48 (FIG. 16). The conductive material 54 may comprise copper lined with a thin refractory metal liner, e.g., tantalum, or other similarly used material. The surface of the second wiring level 50 is polished, using conventional techniques, to remove the excess conductive material 54, leaving the conductive material 54 within the via trench 44 and wire trenches 46, 48 to form a conductive dual damascene feature 60 and a conductive single damascene feature 62 (FIG. 17).

Formation of air gaps within the metal wiring levels of the present invention provides a decreased overall capacitance of the device. This is particularly helpful as devices become smaller and smaller, and the distance between device features continues to decrease.

The invention claimed is:

1. A semiconductor device, comprising:
a substrate;
a first wiring level on a top surface of the substrate, said first wiring level comprising alternating layers of a first dielectric material and a second dielectric material, said layers of the first dielectric material comprising a plurality of layers of the first dielectric material, said layers of the second dielectric material comprising a plurality of layers of the second dielectric material;
a first trench and a second trench each extending through the first wiring level, from a top surface of the first wiring level to the top surface of the substrate;
a first layered structure comprising a portion of all of the alternating layers, said first layered structure being disposed between the first and second trenches and extending from the top surface of the first wiring level to the top surface of the substrate; and
a dielectric liner conformally deposited on a bottom wall of the first trench, a sidewall of the first trench, a sidewall of the second trench, and a bottom wall of the second trench,
wherein the first dielectric material within the first layered structure in each layer of first dielectric material is disposed between a first air gap and a second air gap within the first layered structure in each layer of first dielectric material,
wherein the first and second air gaps within the first layered structure in each layer of first dielectric material are respectively bounded by the liner on the sidewall of the first and second trenches,
wherein the second dielectric material within the first layered structure in each layer of second dielectric material is in direct mechanical contact with the sidewall of the first trench and the sidewall of the second trench.

2. The semiconductor device of claim 1,
wherein the first and second air gaps within the first layered structure in each layer of first dielectric material directly interface with an interior space of the first and second trenches respectively, and wherein the second dielectric material within the first layered structure in each layer of second dielectric material is in direct mechanical contact with the interior space of the first and second trenches.

3. A semiconductor device, comprising:
a substrate;
a first wiring level on a top surface of the substrate, said first wiring level comprising alternating layers of a first dielectric material and a second dielectric material, said layers of the first dielectric material comprising a plurality of layers of the first dielectric material, said layers of the second dielectric material comprising a plurality of layers of the second dielectric material;
a first trench and a second trench each extending through the first wiring level, from a top surface of the first wiring level to the top surface of the substrate;
a first layered structure comprising a portion of all of the alternating layers, said first layered structure being disposed between the first and second trenches and extending from the top surface of the first wiring level to the top surface of the substrate; and
a continuous dielectric liner conformally deposited on a bottom wall of the first trench, a sidewall of the first trench, a top surface of the first layered structure, a sidewall of the second trench, and a bottom wall of the second trench,
wherein the first dielectric material within the first layered structure in each layer of first dielectric material is disposed between a first air gap and a second air gap within the first layered structure in each layer of first dielectric material,
wherein the first and second air gaps within the first layered structure in each layer of first dielectric material are respectively bounded by the liner on the sidewall of the first and second trenches,
wherein the second dielectric material within the first layered structure in each layer of second dielectric material is in direct mechanical contact with the sidewall of the first trench and the sidewall of the second trench.

4. The semiconductor device of claim 3, further comprising a first conductive material filling the first and second trenches and extending above and outside the first and second trenches.

5. The semiconductor device of claim 3, wherein the first dielectric material within a bottom layer of the alternating layers is in direct mechanical contact with the substrate.

6. The semiconductor device of claim 5, wherein a top surface of a top layer of the alternating layers is coplanar with the top surface of the first wiring level, and wherein the top layer comprises the second dielectric material.

7. The semiconductor device of claim 3, wherein the substrate is a pre-metal dielectric (PMD) substrate, wherein the first dielectric material comprises an organic dielectric material selected from the group consisting of polyarylene ether (SILK™), parylene (N), parylene (F), Teflon, porous polyarylene ether (SILK™), porous parylene (N), porous parylene (F) and porous Teflon, and wherein the second dielectric material comprises an inorganic dielectric material selected from the group consisting of OSG, $SiO_2$, FSG, MSQ, porous OSG, porous $SiO_2$, porous FSG, and porous MSQ.

8. The semiconductor device of claim 3, wherein the continuous dielectric liner comprises a material selected from the group consisting of SiCOH, $SiO_2$, SiN, SiC, and SiCN.

9. A semiconductor device, comprising:
a substrate;
a first wiring level on a top surface of the substrate, said first wiring level comprising alternating layers of a first dielectric material and a second dielectric material, said layers of the first dielectric material comprising a plurality of layers of the first dielectric material, said layers of the second dielectric material comprising a plurality of layers of the second dielectric material;
a first trench and a second trench each extending through the first wiring level, from a top surface of the first wiring level to the top surface of the substrate;
a first layered structure comprising a portion of all of the alternating layers of the first wiring level, said first layered structure disposed between the first and second trenches and extending from the top surface of the first wiring level to the top surface of the substrate;
a first dielectric liner conformally deposited on a bottom wall and a sidewall of the first trench and a second dielectric liner conformally deposited on a bottom wall and a sidewall of the second trench;
a first conductive material filling the first and second trenches to form a first wire in the first trench and a second wire in the second trench, wherein a top surface of the first wire, a top surface of the first layered structure, and a top surface of the second wire are coplanar,
wherein the first dielectric material within the first layered structure in each layer of first dielectric material is disposed between a first air gap and a second air gap within the first layered structure in each layer of first dielectric material,
wherein the first and second air gaps within the first layered structure in each layer of first dielectric material are respectively bounded by the liner on the sidewall of the first and second trenches,
wherein the second dielectric material within the first layered structure in each layer of second dielectric material is in direct mechanical contact with the sidewall of the first trench and the sidewall of the second trench.

10. The semiconductor device of claim 9, further comprising an insulative layer on the first wiring level, wherein the insulative layer is in direct mechanical contact with the top surface of the first wire, the top surface of the first layered structure, and the top surface of the second wire.

11. The semiconductor device of claim 10, further comprising a second wiring level on a top surface of the insulative layer and in direct mechanical contact with the top surface of the insulative layer, said second wiring level comprising alternating layers of a third dielectric material and a fourth dielectric material, said layers of the third dielectric material comprising a plurality of layers of the third dielectric material, said layers of the fourth dielectric material comprising a plurality of layers of the fourth dielectric material, wherein a top surface of the second wiring level is further from the top surface of the insulative layer than is any other surface of the second wiring level.

12. The semiconductor device of claim 11, further comprising a third trench extending through the second wiring level and the insulative layer, from the top surface of the second wiring level to the top surface of the first wire.

13. The semiconductor device of claim 11, further comprising:
a third trench extending through the second wiring level and the insulative layer, from the top surface of the second wiring level to the top surface of the first wire, wherein the third trench is a dual damascene structure being wider in the second wiring level than in the insulative layer;

a fourth trench extending through the second wiring level, from the top surface of the second wiring level to the top surface of the insulative layer; and a second layered structure comprising a portion of all of the alternating layers of the second wiring level, said second layered structure disposed between the third and fourth trenches and extending from the top surface of the second wiring level to the top surface of the insulative layer.

14. The semiconductor device of claim 13, further comprising:

a continuous dielectric liner conformally deposited on a bottom wall of the third trench, a sidewall of the third trench, a top surface of the second layered structure, a sidewall of the fourth trench, and a bottom wall of the fourth trench, wherein the third dielectric material within the second layered structure in each layer of third dielectric material is disposed between a third air gap and a fourth air gap within the second layered structure in each layer of third dielectric material, wherein the third and fourth air gaps within the second layered structure in each layer of third dielectric material are respectively bounded by the liner on the sidewall of the third and fourth trenches, wherein the fourth dielectric material within the second layered structure in each layer of fourth dielectric material is in direct mechanical contact with the liner on the sidewall of the third trench and the liner on the sidewall of the fourth trench.

15. The semiconductor device of claim 14, further comprising a second conductive material filling the third and fourth trenches and extending above and outside the third and fourth trenches.

16. The semiconductor device of claim 13, further comprising:

a second conductive material filling the third and fourth trenches to form a third wire in the third trench and a fourth wire in the fourth trench, wherein a top surface of the third wire, a top surface of the second layered structure, and a top surface of the fourth wire are coplanar, wherein the third dielectric material within the second layered structure in each layer of third dielectric material is disposed between a third air gap and a fourth air gap within the second layered structure in each layer of third dielectric material, wherein the third and fourth air gaps within the second layered structure in each layer of third dielectric material are respectively bounded by the liner on the sidewall of the third and fourth trenches, wherein the fourth dielectric material within the second layered structure in each layer of fourth dielectric material is in direct mechanical contact with the liner on the sidewall of the third trench and the liner on the sidewall of the fourth trench.

17. The semiconductor device of claim 9, wherein the first dielectric material within a bottom layer of the alternating layers is in direct mechanical contact with the substrate.

18. The semiconductor device of claim 17, wherein a top surface of a top layer of the alternating layers is coplanar with the top surface of the first wiring level, and wherein the top layer comprises the second dielectric material.

19. The semiconductor device of claim 9, wherein the substrate is a pre-metal dielectric (PMD) substrate, wherein the first dielectric material comprises an organic dielectric material selected from the group consisting of polyarylene ether (SILK™), parylene (N), parylene (F), Teflon, porous polyarylene ether (SILK™), porous parylene (N), porous parylene (F) and porous Teflon, and wherein the second dielectric material comprises an inorganic dielectric material selected from the group consisting of OSG, $SiO_2$, FSG, MSQ, porous OSG, porous $SiO_2$, porous FSG, and porous MSQ.

20. The semiconductor device of claim 9, wherein the first and second dielectric liners comprise a material selected from the group consisting of SiCOH, $SiO_2$, SiN, SiC, and SiCN.

* * * * *